(12) United States Patent
Lee

(10) Patent No.: US 7,453,760 B2
(45) Date of Patent: Nov. 18, 2008

(54) METHOD FOR ACCESSING DUAL-PORT MEMORY

(75) Inventor: Chung-Lin Lee, Longtan Shiang (TW)

(73) Assignee: Institute of Nuclear Energy Atomic Energy Council, Taoyuan County (TW)

( * ) Notice: Subject to any disclaimer, the term of this patent is extended or adjusted under 35 U.S.C. 154(b) by 251 days.

(21) Appl. No.: 11/512,410

(22) Filed: Aug. 30, 2006

(65) Prior Publication Data

US 2007/0233968 A1    Oct. 4, 2007

(30) Foreign Application Priority Data

Apr. 4, 2006    (TW) .............................. 95111902 A

(51) Int. Cl.
*G11C 8/00*    (2006.01)

(52) U.S. Cl. .............................. 365/230.05; 365/189.01
(58) Field of Classification Search ............ 365/230.05, 365/189.01
See application file for complete search history.

(56) References Cited

U.S. PATENT DOCUMENTS 6,119,213 A  *  9/2000  Robbins ...................... 711/202

\* cited by examiner

*Primary Examiner*—Son Dinh
(74) *Attorney, Agent, or Firm*—Troxell Law Office, PLLC

(57) ABSTRACT

A method for accessing a dual-port memory, wherein a data block programming procedure is performed upon the dual-port memory using status flags and check codes to determine the access sequence of the data so as to enable data exchange between two central processing units (CPU's) to be processed rapidly and correctly without interruption and thus to enhance the performance of the two CPU's.

11 Claims, 8 Drawing Sheets

| Address | Data Block | Address | Data Block | Address | Data Block | Address | Data Block |
|---|---|---|---|---|---|---|---|
| 0~62 | 1st Variable Data | 64~126 | 1st Variable Data | 128~190 | 2ed Variable Data | 192~254 | 2ed Variable Data |
| 63 | 1st status Flag | 127 | 1st Check Code | 191 | 2nd status Flag | 255 | 2nd Check Code |

FIG. 2

| Adress | Data Block | Adress | Data Block | Adress | Data Block | Adress | Data Block |
|---|---|---|---|---|---|---|---|
| 00~01 | Temp of #1 Regulator | 64~65 | Temp of #1 Regulator | 128~129 | Intensity of Hot Air in #1 Regulator | 192~193 | Intensity of Hot Air in #1 Regulator |
| 02~03 | Temp of #2 Regulator | 66~67 | Temp of #2 Regulator | 130~131 | Intensity of Hot Air in #2 Regulator | 194~195 | Intensity of Hot Air in #2 Regulator |
| 04~07 | Temp of #3 Regulator | 68~71 | Temp of #3 Regulator | 132~135 | Intensity of Hot Air in #3 Regulator | 196~199 | Intensity of Hot Air in #3 Regulator |
| 08~11 | Temp of #4 Regulator | 72~75 | Temp of #4 Regulator | 136~139 | Intensity of Hot Air in #4 Regulator | 200~203 | Intensity of Hot Air in #4 Regulator |
| 12~15 | Temp of #5 Regulator | 76~79 | Temp of #5 Regulator | 140~143 | Intensity of Hot Air in #5 Regulator | 204~207 | Intensity of Hot Air in #5 Regulator |
| 16~23 | Temp of #6 Regulator | 80~87 | Temp of #6 Regulator | 144~151 | Intensity of Hot Air in #6 Regulator | 208~215 | Intensity of Hot Air in #6 Regulator |
| 24~31 | Temp of #7 Regulator | 88~95 | Temp of #7 Regulator | 152~159 | Intensity of Hot Air in #7 Regulator | 216~223 | Intensity of Hot Air in #7 Regulator |
| 32~39 | Temp of #8 Regulator | 96~103 | Temp of #8 Regulator | 160~167 | Intensity of Hot Air in #8 Regulator | 224~231 | Intensity of Hot Air in #8 Regulator |
| 40~47 | Temp of #9 Regulator | 104~111 | Temp of #9 Regulator | 168~175 | Intensity of Hot Air in #9 Regulator | 232~239 | Intensity of Hot Air in #9 Regulator |
| 48~55 | Temp of #10 Regulator | 112~119 | Temp of #10 Regulator | 176~183 | Intensity of Hot Air in #10 Regulator | 240~247 | Intensity of Hot Air in #10 Regulator |
| 56~60 | Temp of #11 Regulator | 120~124 | Temp of #11 Regulator | 184~188 | Intensity of Hot Air in #11 Regulator | 248~252 | Intensity of Hot Air in #11 Regulator |
| 61~62 | Temp of #12 Regulator | 125~126 | Temp of #12 Regulator | 189~190 | Intensity of Hot Air in #12 Regulator | 253~254 | Intensity of Hot Air in #12 Regulator |
| 63 | 1st status Flag | 127 | 1st Check Code | 191 | 2st status Flag | 255 | 2st Check Code |

FIG. 8

METHOD FOR ACCESSING DUAL-PORT MEMORY

BACKGROUND OF THE INVENTION

1. Field of the Invention

The present invention generally relates to a method for accessing a dual-port memory and more particularly, to a method wherein a data block programming procedure is performed upon the dual-port memory using status flags and check codes to determine the access sequence of the data.

2. Description of the Prior Art

In recent years, with the development in science and technology, the demand on the operating speed of central processing units (CPU's) increases. However, the operating speed of a single CPU is far from satisfactory. Therefore, in many high-speed communication or computing systems, two CPU's are required to operate at the same time and data exchange is enabled between the two CPU's. Currently, the best approach is using a dual-port RAM (DPR) as an interface between two CPU's. Since the dual-port memory has a larger buffer capacity so that the each of the two CPU's regard the dual-port memory as its exclusive memory. Using such a dual-port memory, a simple access command enables data exchange between the two CPU's. Therefore, the dual-port memory has attracted tremendous attention.

Presently, the conventional dual-port memory has a very high buffer capacity and allows heavy traffic so as to randomly access the data in the memory. The dual-port memory enables two interface devices such as CPU's with two independent clock pulses to access the data in the dual-port memory. However, when the two CPU's access a memory on the same address to both write in or read from simultaneously, mistakes may occur and the CPU's may take a considerable long-time to handle. The long access time as well as wasted processor performance is a loss to the user.

Therefore, there exists a need in providing a method for accessing a dual-port memory by performing a data block programming procedure upon the dual-port memory and controlling the access sequence of the data so that the user can access the dual-port memory rapidly and correctly without interruption.

SUMMARY OF THE INVENTION

It is a primary object of the present invention to provide a method for accessing a dual-port memory so that two CPU's connected through the dual-port memory operate independently without waiting for the dual-port memory while reading or writing data so as to enhance the performance of the CPU's.

It is a secondary object of the present invention to provide a method for accessing a dual-port memory so that two CPU's connected through the dual-port memory access data rapidly and correctly during data exchange.

In order to achieve the foregoing objects, the present invention provides a method for accessing a dual-port memory connecting a first central processing unit and a second central processing unit for reading/writing data.

A data writing process performed by the first central processing unit comprises steps of: determining a data block for the first central processing unit to write a first variable data in according to a first status flag; writing the first variable data in the first data block and resetting the first status flag to indicate a second data block is busy by the first central processing unit if the first status flag indicates the first data block is busy; and writing the first variable data in the second data block and resetting the first status flag to indicate the first data block is busy by the first central processing unit if the first status flag indicates the second data block is busy.

A data writing process performed by the second central processing unit comprises steps of: determining a data block for the second central processing unit to write a second variable data in according to a second status flag; writing the second variable data in a third data block and resetting the second status flag to indicate a fourth data block is busy by the second central processing unit if the second status flag indicates the third data block is busy; and writing the second variable data in the fourth data block and resetting the second status flag to indicate the third data block is busy by the second central processing unit if the second status flag indicates the fourth data block is busy.

A data reading process performed by the second central processing unit comprises steps of: determining a data block for the second central processing unit to read the first variable data from according to the first status flag; reading the first variable data from the second data block by the second central processing unit if the first status flag indicates the first data block is busy; and reading the first variable data from the first data block by the second central processing unit if the first status flag indicates the second data block is busy.

A data reading process performed by the first central processing unit comprises steps of: determining a data block for the first central processing unit to read a second variable data from according to the second status flag; reading the second variable data from the fourth data block by the first central processing unit if the second status flag indicates the third data block is busy; and reading the second variable data from the third data block by the first central processing unit if the second status flag indicates the fourth data block is busy.

Preferably, the present invention provides a verification process using a first check code and a second check code so as to determine whether the second variable data read from the third data block or the fourth data block by the first central processing unit is correct and to determine whether the first variable data read from the first data block or the second data block by the second central processing unit is correct.

Therefore, the method for accessing a dual-port memory according to the present invention is characterized in that the second central processing unit reads the first variable data previously stored in the dual-port memory if the second central processing unit is to read the first variable data while the first central processing unit is writing the first variable data in the dual-port memory. Therefore, the first and second central processing units do not access the dual-port memory simultaneously to cause errors. Similarly, the first central processing unit reads the second variable data previously stored in the dual-port memory by second central processing unit. Accordingly, the first and second central processing units exchange data rapidly and overcome the problems of the prior art. On the other hand, the present invention provides a verification process using check codes so as to determine whether the data is correct

BRIEF DESCRIPTION OF THE DRAWINGS

The objects, spirits and advantages of the preferred embodiment of the present invention will be readily understood by the accompanying drawings and detailed descriptions, wherein:

FIG. 2 is a schematic diagram showing memory programming of a dual-port memory according to the preferred embodiment of the present invention;

FIG. 8 is a schematic diagram showing memory programming for temperature control using the preferred -embodiment of the present invention.

DETAILED DESCRIPTION OF THE PREFERRED EMBODIMENT

The present invention providing a method for accessing a dual-port memory can be exemplified by the preferred embodiments as described hereinafter.

Figure 1:
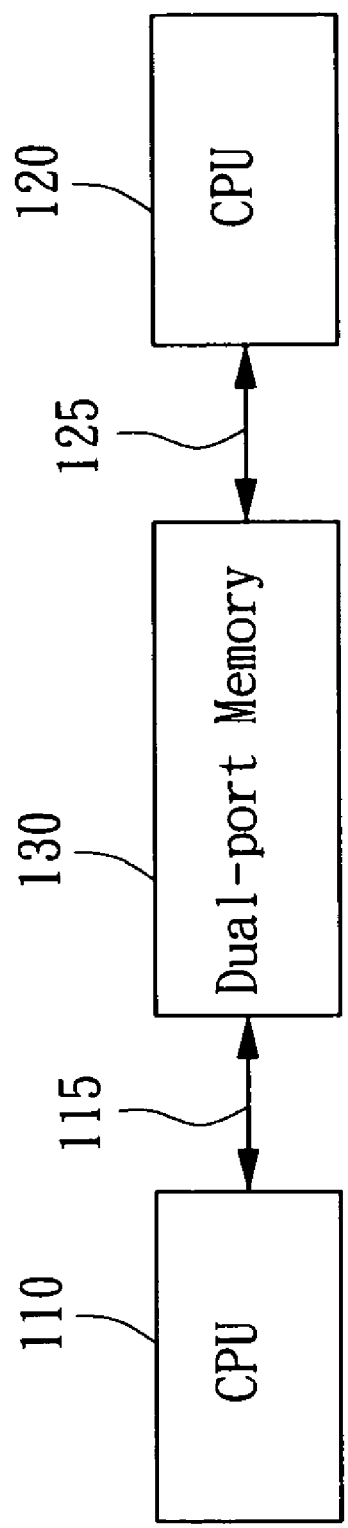
FIG. 1 is a schematic diagram showing two CPU's connected through a dual-port memory for data exchange according to the preferred embodiment of the present invention.

Please refer to FIG. 1, which is a schematic diagram showing two CPU's connected through a dual-port memory for data exchange according to the preferred embodiment of the present invention. The CPU 110 writes the processed data in a binary format through a bus 115 in the dual-port memory 130. Similarly, the CPU 120 writes the processed data in a binary format through a bus 125 in the dual-port memory 130. In order for the two CPU's 110 and 120 to rapidly exchange data, the CPU 110 has to read the data written in by the CPU 120 from the dual-port memory 130. Similarly, the CPU 120 has to read the data written in the CPU 110 from the dual-port memory 130.

Please refer to FIG. 2, which is a schematic diagram showing memory programming of a dual-port memory according to the preferred embodiment of the present invention. Let us take a dual-port memory of 256 bytes for example. To begin with, the memory is categorized into two divisions, wherein the data blocks with respect to addresses 0~127 are governed by the CPU 110 and the data blocks with respect to addresses 128~255 are governed by the CPU 120.

The data blocks with respect to addresses 0~127 further divided into four sub-divisions, namely the data blocks with respect to addresses 0~62, 63, 64~126 and 127. The first data block with respect to addresses 0~62 are used to store the first variable data written in by the CPU 110 in a time interval. The second data block with respect to addresses 64~126 are used to store the first variable data written in by the CPU 110 in another time interval. The data block with respect to address 63 is used to store a first status flag and the data block with respect to address 127 is used to store a first check code.

Similarly, the data blocks with respect to addresses 128~255 further divided into four sub-divisions, namely the data blocks with respect to addresses 128~190, 191, 192~254 and 255. The third data block with respect to addresses 128~190 are used to store the second variable data written in by the CPU 120 in a time interval. The fourth data block with respect to addresses 192~254 are used to store the second variable data written in by the CPU 120 in another time interval. The data block with respect to address 191 is used to store a second status flag and the data block with respect to address 255 is used to store a second check code.

The aforesaid addresses corresponding to the variable data, the status flags and the check codes are only exemplary and thus not limited thereby. Moreover, the data blocks used to store the variable data, the status flags and the check codes are only exemplary and thus not limited thereby. The user can use the data block to store the variable data, the status flags and the check codes in any other fashion.

Figure 3:
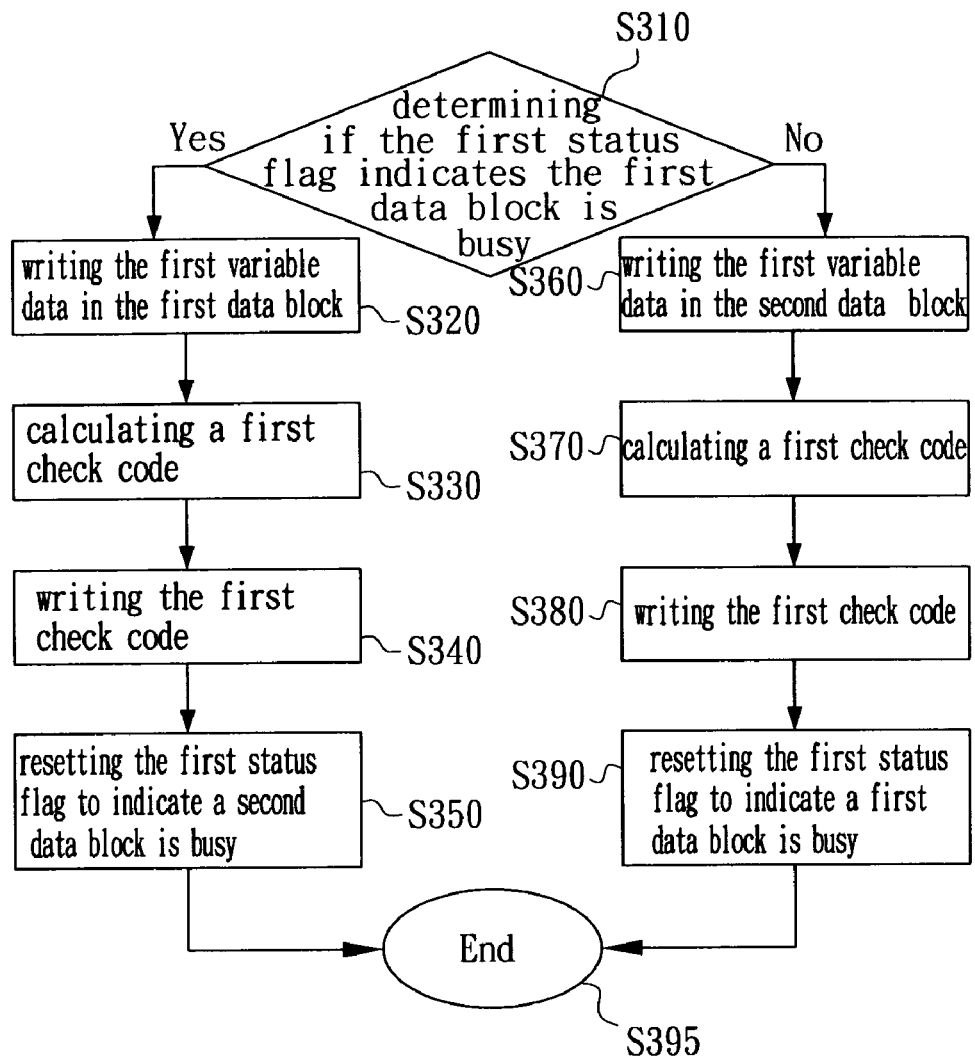
FIG. 3 is a first flow-chart describing a data writing process according to the preferred embodiment of the present invention.

Please refer to FIG. 3, which is a first flow-chart describing a data writing process according to the preferred embodiment of the present invention. In FIG. 3, a data writing process performed by the first CPU 110 to write in the dual-port memory 130 is described. To begin with, in Step S310, it is determined if the first status flag indicates the first data block is busy. If the first status flag indicates the first data block is busy, the first variable data is written in the first data block, as described in Step S320. After the first variable data is written in the first data block, a first check code is calculated, as described in Step S330. Then, in Step S340, the first check code is written. The first status flag is reset to indicate a second data block is busy, as described in Step S350. After Step S310, if the first status flag indicates the first data block is not busy, (instead, the second data block is busy,) the first variable data is written in the second data block, as described in Step S360. After the first variable data is written in the second data block, a first check code is calculated, as described in Step S370. Then, in Step S380, the first check code is written. The first status flag is reset to indicate the first data block is busy, as described in Step S390. The process ends after Steps S350 or Step S390 is performed, as described in Step S395. When the next first variable data is to be written in the memory, Steps S310 to S395 will be performed again.

Figure 4:
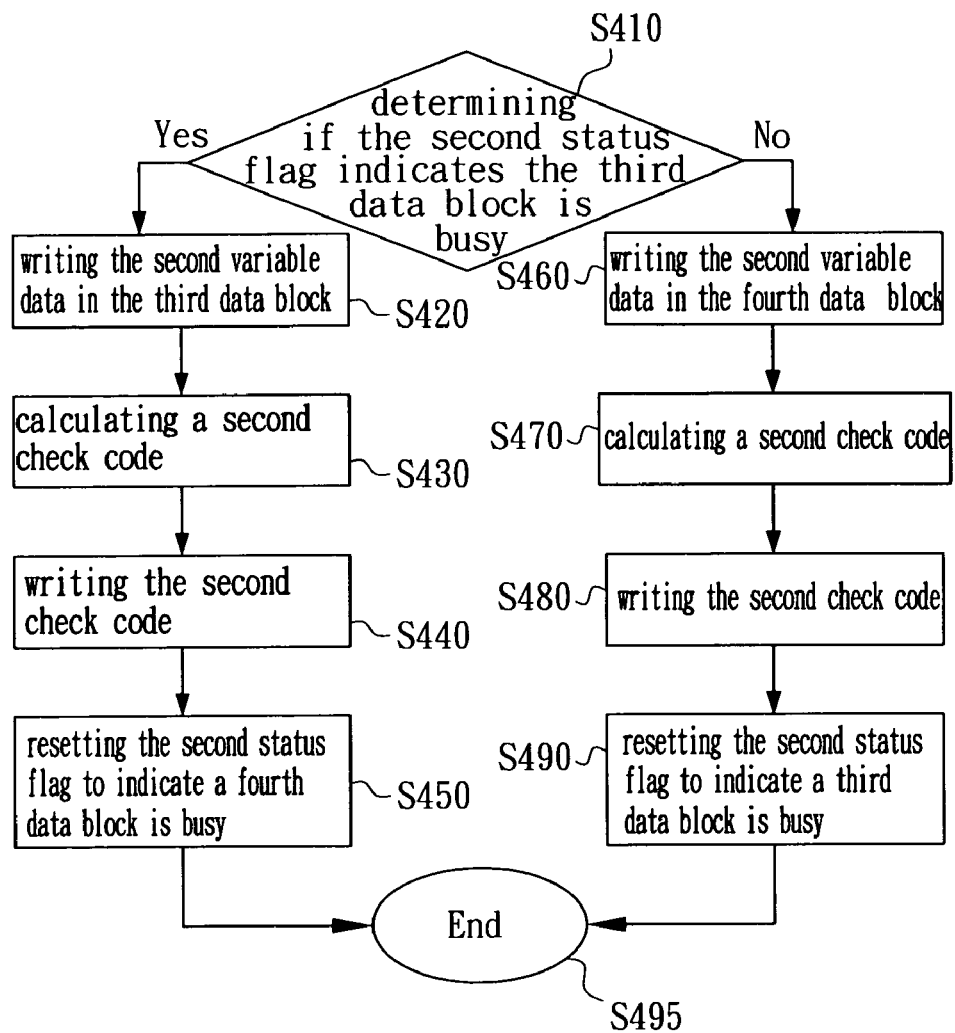
FIG. 4 is a second flow-chart describing a data writing process according to the preferred embodiment of the present invention.

FIG. 4 is a second flow-chart describing a data writing process according to the preferred embodiment of the present invention. In FIG. 4, a data writing process performed by the second CPU 120 to write in the dual-port memory 130 is described. To begin with, in Step S410, it is determined if the second status flag indicates the third data block is busy. If the second status flag indicates the third data block is busy, the second variable data is written in the third data block, as described in Step S420. After the second variable data is written in the third data block, a second check code is calculated, as described in Step S430. Then, in Step S440, the second check code is written. The second status flag is reset to indicate a fourth data block is busy, as described in Step S450. After Step S410, if the second status flag indicates the third data block is not busy, (instead, the fourth data block is busy,) the second variable data is written in the fourth data block, as described in Step S460. After the second variable data is written in the fourth data block, a second check code is calculated, as described in Step S470. Then, in Step S480, the second check code is written. The second status flag is reset to indicate the third data block is busy, as described in Step S490. The process ends after Step S450 or Step S490 is performed, as described in Step S495. When the next second variable data is to be written in the memory, Steps S410 to S495 will be performed again.

Figure 5:
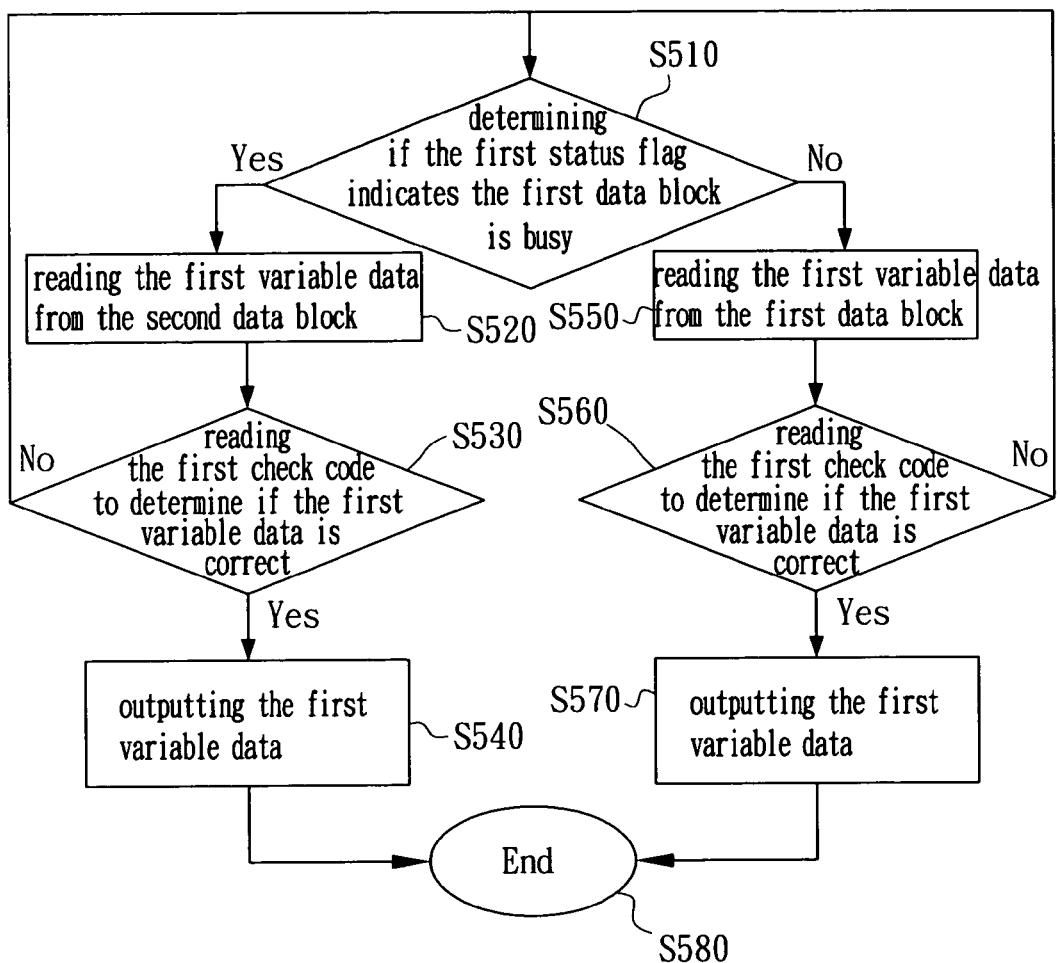
FIG. 5 is a first flow-chart describing a data reading process according to the preferred embodiment of the present invention.

FIG. 5 is a first flow-chart describing a data reading process according to the preferred embodiment of the present invention. In FIG. 5, a data reading process performed by the second CPU 120 to read the data written by the first CPU 110 from the dual-port memory 130 is described. To begin with, in Step S510, it is determined if the first status flag indicates the first data block is busy. If the first status flag indicates the first data block is busy, the first variable data is read from the second data block, as described in Step S520. Then in Step S530, the first check code is read to determine if the first variable data is correct. If the first variable data is correct, the first variable data is output, as described in Step S540. If the first variable data is incorrect, the process goes back to Step S510. After Step S510, if the first status flag indicates the first data block is not busy, (instead, the second data block is busy,) the first variable data is read from the first data block, as described in Step S550. Then in Step S560, the first check code is read to determine if the first variable data is correct. If the first variable data is correct, the first variable data is output, as described in Step S570. If the first variable data is incorrect, the process goes back to Step S510. The process ends after Steps S540 or Step S570 is performed, as described in Step S580. When the next data is to read from the memory, Steps S510 to S580 will be performed again.

Figure 6:
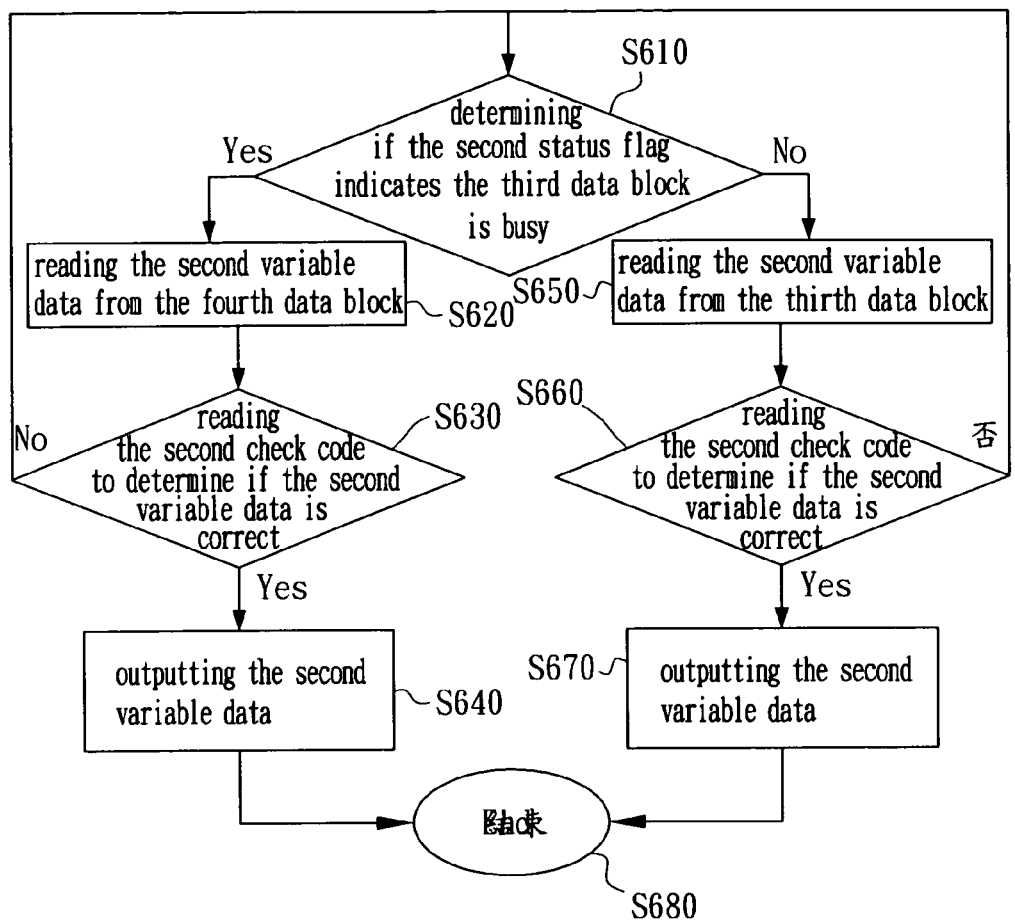
FIG. 6 is a second flow-chart describing a data reading process according to the preferred embodiment of the present invention.

FIG. 6 is a second flow-chart describing a data reading process according to the preferred embodiment of the present invention. In FIG. 6, a data reading process performed by the first CPU 110 to read the data written by the second CPU 120 from the dual-port memory 130 is described. To begin with, in Step S610, it is determined if the second status flag indicates the third data block is busy. If the second status flag indicates the third data block is busy, the second variable data is read from the fourth data block, as described in Step S620. Then in Step S630, the second check code is read to determine if the second variable data is correct. If the second variable data is correct, the second variable data is output, as described in Step S640. If the second variable data is incorrect, the process goes back to Step S610. After Step S610, if the second status flag indicates the third data block is not busy, (instead, the fourth data block is busy,) the second variable data is read from the third data block, as described in Step S650. Then in Step S660, the second check code is read to determine if the second variable data is correct. If the second variable data is correct, the second variable data is output, as described in Step S670. If the second variable data is incorrect, the process goes back to Step S610. The process ends after Steps S640 or Step S670 is performed, as described in Step S680. When the next data is to read from the memory, Steps S610 to S680 will be performed again.

The check codes are used to make sure there is no error during data exchange so as to improve the reliability of data exchange. For example, after the first variable data is written, all the first variable data can be summed up as a check code. If the check code is different from a summed value of the read first variable data, the read data is incorrect. However, the aforesaid example is only exemplary and, the present invention is not limit thereby.

Figure 7:
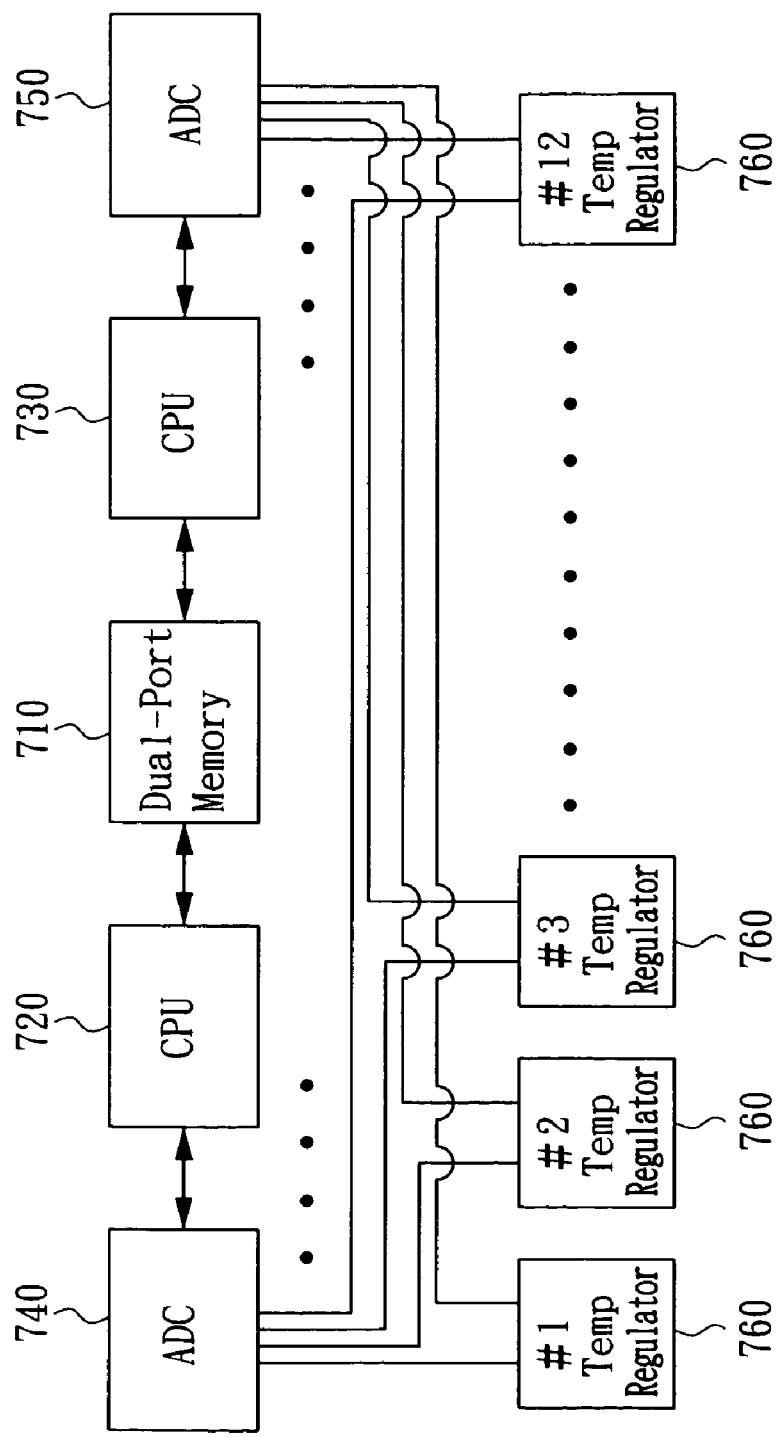
FIG. 7 is a schematic diagram showing temperature control using the preferred embodiment of the present invention.

Please refer to FIG. 7, which is a schematic diagram showing temperature control using the preferred embodiment of the present invention. In FIG. 7, the schematic diagram for temperature control comprises a dual-port memory 710, two CPU's 720 and 730, two analog-to-digital converters (ADC's) 740 and 750 and a plurality of temperature regulators 760. Each of the temperature regulators 760 is labeled (from #1 to #12) and is installed with a temperature sensor for detecting the temperature inside each of the temperature regulators 760 and a heating fan with an adjustable hot air intensity. Each temperature sensor transmits temperature information inside the temperature regulator in an analog format to the ADC 740. The ADC 740 converts the temperature information in an analog signal into a digital signal so that the CPU 720 writes the binary temperature information inside the temperature regulator in the dual-port memory 710. Similarly, each heating fan transmits the hot air intensity information in an analog format to the ADC 750. The ADC 750 converts the hot air intensity information in an analog signal into a digital signal so that the CPU 730 writes the binary hot air intensity information in the dual-port memory 710.

In order to correctly control the inside temperature in each of the temperature regulators 760, the CPU's 720 and 730 have to exchange the temperature information and the hot air intensity information. For example, after the inside temperature in each of the temperature regulators 760 is converted into a digital format, the CPU 720 writes the variable data (the temperature information) in the dual-port memory 710. Then the CPU 730 correctly reads the variable data (the temperature information) and compares the variable data (the temperature information) to a standard temperature value so as to determine which one among the temperature regulators 760 has higher temperature and which one among the temperature regulators 760 has lower temperature. This helps to adjust each of the heating fans so as to keep the temperature value of each temperature regulator 760. Finally, the CPU writes the variable information (the heating fan information) in the dual-port memory 710.

Please refer to FIG. 8, which is a schematic diagram showing memory programming for temperature control using the preferred embodiment of the present invention. When the CPU 720 writes the first variable data (the temperature information of each of the temperature regulators) in the first data block, the first status flag indicates the first data block with respect to addresses 00~62. If the CPU 730 is to read the first variable data, the CPU 730 will read the completely written first variable data that has been previously stored in the second data block since the first status flag indicates the first data block is busy. As being verified by the first check code to be correct, the second variable data (the hot air intensity information of each of the temperature regulators) is written in the third data block with respect to addresses 128~190 or the fourth data block with respect to addresses 192~254. The writing sequence depends on whether the second status flag indicates the third data block or the fourth data block to be busy or not. Accordingly, the two CPU's 720 and 730 can exchange data following the reading/writing processes in FIG. 3 to FIG. 6.

The aforementioned embodiment is only exemplary to use the method for accessing a dual-port memory according to the present invention. The first variable data governed by one of the two CPU's is not limited to temperature parameters but applicable to pressure and humidity parameter. The second variable data governed by another of the two CPU's is applicable to various parameters corresponding to the first variable data. The present invention is characterized in that the two CPU's exchange the variable data correctly through the dual-port memory using the method for accessing a dual-port memory of the present invention.

According to the above discussion, it is apparent that the present invention discloses a method for accessing a dual-port memory so that two CPU's connected through the dual-port memory operate independently without waiting for the dual-port memory while reading or writing data and exchange data between two central processing units (CPU's) rapidly and correctly without errors.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A method for accessing a dual-port memory connecting a first central processing unit and a second central processing unit for reading/writing data, the method comprising steps of:

(a) performing a data writing process, comprising steps of:

determining a data block for the first central processing unit to write a first variable data in according to a first status flag;

writing the first variable data in the first data block and resetting the first status flag to indicate a second data block is busy by the first central processing unit if the first status flag indicates the first data block is busy; and writing the first variable data in the second data block and resetting the first status flag to indicate the first data block is busy by the first central processing unit if the first status flag indicates the second data block is busy; and (b) performing a data reading process, comprising steps of:

determining a data block for the second central processing unit to read the first variable data from according to the first status flag;

reading the first variable data from the second data block by the second central processing unit if the first status flag indicates the first data block is busy; and reading the first variable data from the first data block by the second central processing unit if the first status flag indicates the second data block is busy.

2. The method for accessing a dual-port memory as recited in claim 1, wherein the step (a) further comprises steps of:

determining a data block for the second central processing unit to write a second variable data in according to a second status flag;

writing the second variable data in a third data block and resetting the second status flag to indicate a fourth data block is busy by the second central processing unit if the second status flag indicates the third data block is busy; and writing the second variable data in the fourth data block and resetting the second status flag to indicate the third data block is busy by the second central processing unit if the second status flag indicates the fourth data block is busy.

3. The method for accessing a dual-port memory as recited in claim 2, wherein the step (b) further comprises steps of:

determining a data block for the first central processing unit to read a second variable data from according to the second status flag;

reading the second variable data from the fourth data block by the first central processing unit if the second status flag indicates the third data block is busy; and reading the second variable data from the third data block by the first central processing unit if the second status flag indicates the fourth data block is busy.

4. The method for accessing a dual-port memory as recited in claim 1, wherein the step (a) further comprises a step of:

writing a first check code if the first status flag indicates the first data block is busy.

5. The method for accessing a dual-port memory as recited in claim 1, wherein the step (a) further comprises a step of:

writing a first check code if the first status flag indicates the second data block is busy.

6. The method for accessing a dual-port memory as recited in claim 4, wherein the step (b) further comprises steps of:

reading the first check code; and determining whether the first variable data read from the second data block by the second central processing unit is correct according to the first check code.

7. The method for accessing a dual-port memory as recited in claim 5, wherein the step (b) further comprises steps of:

reading the first check code; and determining whether the first variable data read from the first data block by the second central processing unit is correct according to the first check code.

8. The method for accessing a dual-port memory as recited in claim 3, wherein the step (a) further comprises a step of:

writing a second check code if the second status flag indicates the third data block is busy.

9. The method for accessing a dual-port memory as recited in claim 3, wherein the step (a) further comprises a step of:

writing a second check code if the second status flag indicates the fourth data block is busy.

10. The method for accessing a dual-port memory as recited in claim 8, wherein the step (b) further comprises steps of:

reading the second check code; and determining whether the second variable data read from the fourth data block by the first central processing unit is correct according to the second check code.

11. The method for accessing a dual-port memory as recited in claim 9, wherein the step (b) further comprises steps of:

reading the second check code; and determining whether the second variable data read from the third data block by the first central processing unit is correct according to the second check code.

* * * * *